US010915125B2

(12) United States Patent
Lin et al.

(10) Patent No.: US 10,915,125 B2
(45) Date of Patent: Feb. 9, 2021

(54) ELECTRONIC DEVICE AND POWER TRANSMISSION CIRCUIT OF SAME

(71) Applicant: PEGATRON CORPORATION, Taipei (TW)

(72) Inventors: Feng-Yu Lin, Taipei (TW); Hsiao-Wei Sung, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/534,979

(22) Filed: Aug. 7, 2019

(65) Prior Publication Data

US 2020/0103929 A1  Apr. 2, 2020

(30) Foreign Application Priority Data

Oct. 1, 2018  (TW) .............................. 107134660 A

(51) Int. Cl.
  *G05F 1/575* (2006.01)
(52) U.S. Cl.
  CPC .................................. *G05F 1/575* (2013.01)
(58) Field of Classification Search
  CPC ... G05F 1/575; G05F 1/56; H03K 2217/0081; H03K 2217/0063; H03K 2217/0018; H03K 17/005; H03K 17/6874; H03K 17/102; H02M 3/156; H02M 2001/0048; H02M 1/32; H02J 1/10; H02J 13/0003; H02J 1/086; H02J 9/068; Y10T 307/724;
  (Continued)

(56) References Cited

U.S. PATENT DOCUMENTS 6,594,163 B2  7/2003  Tsai
7,298,113 B2  11/2007 Orikasa
7,755,327 B2  7/2010  Tang et al.
(Continued)

FOREIGN PATENT DOCUMENTS

CN  101179198  5/2008
CN  100461582  2/2009
(Continued)

OTHER PUBLICATIONS

Linear Technology, LTC4412, 2002, Whole Document p. 6 and 7 in particular (Year: 2002).*

*Primary Examiner* — Rexford N Barnie
*Assistant Examiner* — Thai H Tran
(74) *Attorney, Agent, or Firm* — J.C. Patents

(57) ABSTRACT

A power transmission circuit includes a first transmission transistor, a second transmission transistor, and a first control circuit. A first terminal of the first transmission transistor is used as a power input terminal of the power transmission circuit. A second terminal of the first transmission transistor is coupled to a first node. A control terminal of the first transmission transistor is coupled to a control node. A first terminal of the second transmission transistor is used as a power output terminal of the power transmission circuit. A second terminal of the second transmission transistor is coupled to the first node. When a voltage of the power output terminal is greater than or equal to a voltage of the power input terminal, the first control circuit outputs a first voltage to the control node, to turn off the first transmission transistor and the second transmission transistor.

9 Claims, 4 Drawing Sheets

(58) Field of Classification Search
CPC ............. Y10T 307/696; Y10T 307/615; Y10T 307/625; Y10T 307/62
See application file for complete search history.

(56) References Cited

U.S. PATENT DOCUMENTS

| | | |
|---|---|---|
| 2002/0044465 A1 | 4/2002 | Tsai |
| 2005/0127871 A1 | 6/2005 | Orikasa |
| 2007/0268726 A1* | 11/2007 | Kojori .................... H02J 1/001 363/65 |
| 2008/0106236 A1 | 5/2008 | Tang et al. |

FOREIGN PATENT DOCUMENTS

| | | |
|---|---|---|
| CN | 107154732 | 9/2017 |
| CN | 206542207 | 10/2017 |
| TW | 513834 | 12/2002 |

\* cited by examiner

ELECTRONIC DEVICE AND POWER TRANSMISSION CIRCUIT OF SAME

CROSS-REFERENCE TO RELATED APPLICATION

This non-provisional application claims priority under 35 U.S.C. § 119(a) to Patent Application No. 107134660 filed in Taiwan, R.O.C. on Oct. 1, 2018, the entire contents of which are hereby incorporated by reference.

BACKGROUND

Technical Field

The application relates to power supply technologies, and in particular, to a power transmission circuit and an electronic device using the power transmission circuit.

Related Art

An existing electronic device usually has various power input ports. The electronic device may receive a plurality of input powers through the power input ports separately, and one of the input powers is used to power a device body in the electronic device. In an architecture in which the input powers are parallel input, a semiconductor is usually serially connected to a power transmission path between each power input port and the device body to prevent a current of an input power that powers the device body from flowing back to another power input port. However, in an on state, the semiconductor has high power consumption, high temperature, and poor power supply efficiency. In addition, because the semiconductor is serially connected to the power transmission path between each power input port and the device body, an input power with the highest voltage powers the device body. As a result, it is less flexible to select a power source for the device body.

SUMMARY

In view of thus, the application provides an electronic device and a power transmission circuit of same, so that the power transmission circuit can have reduced power consumption, lower temperature, and higher power supply efficiency, it can be more flexible to select a power source for a device body of the electronic device.

A power transmission circuit of the application includes a first transmission transistor, a second transmission transistor, and a first control circuit. A first terminal of the first transmission transistor is used as a power input terminal of the power transmission circuit. A second terminal of the first transmission transistor is coupled to a first node. A control terminal of the first transmission transistor is coupled to a control node. A first terminal of the second transmission transistor is used as a power output terminal of the power transmission circuit. A second terminal of the second transmission transistor is coupled to the first node. A control terminal of the second transmission transistor is coupled to the control node. The first control circuit is coupled to the power input terminal, the power output terminal, and the control node. When a voltage of the power output terminal is greater than or equal to a voltage of the power input terminal, the first control circuit outputs a first voltage to the control node, to turn off the first transmission transistor and the second transmission transistor.

In an embodiment of the application, when the voltage of the power output terminal is less than the voltage of the power input terminal, the first control circuit outputs a second voltage to the control node, to turn on the first transmission transistor and the second transmission transistor.

In an embodiment of the application, the first control circuit includes a first input transistor, a voltage divider circuit, a second input transistor, and a capacitor. A first terminal of the first input transistor is coupled to the power input terminal. The second terminal of the first input transistor is coupled to a control terminal of the first input transistor. The voltage divider circuit is coupled between the second terminal of the first input transistor and a ground voltage terminal, and is used to divide a voltage of the second terminal of the first input transistor to generate a third voltage. A first terminal of the second input transistor is coupled to the power output terminal. A second terminal of the second input transistor is coupled to the control node. A control terminal of the second input transistor is coupled to the voltage divider circuit to receive the third voltage. The capacitor is coupled between the second terminal of the second input transistor and the ground voltage terminal.

In an embodiment of the application, the power transmission circuit further includes a second control circuit. The second control circuit is coupled to the first node and the control node, and receives a disable signal. The second control circuit turns off the first transmission transistor and the second transmission transistor in response to the disable signal.

In an embodiment of the application, the second control circuit includes a first control transistor, a first capacitor, a second capacitor, and a second control transistor. A first terminal of the first control transistor is coupled to a ground voltage terminal. A control terminal of the first control transistor receives the disable signal. The first capacitor is coupled between the control terminal of the first control transistor and the ground voltage terminal. A first terminal of the second capacitor is coupled to a second terminal of the first control transistor. A first terminal of the second control transistor is coupled to the control node. A second terminal of the second control transistor is coupled to the first node. A control terminal of the second control transistor is coupled to a second terminal of the second capacitor.

An electronic device of the application includes a device body and at least one power transmission circuit. The device body is coupled to a power bus. A power input terminal of each of the at least one power transmission circuit is used to receive one of at least one input power. The power output terminal of each of the at least one power transmission circuit is coupled to the power bus to power the device body. Each of the at least one power transmission circuit includes a first transmission transistor, a second transmission transistor, and a first control circuit. A first terminal of the first transmission transistor is used as the power input terminal of the power transmission circuit. A second terminal of the first transmission transistor is coupled to a first node. A control terminal of the first transmission transistor is coupled to a control node. A first terminal of the second transmission transistor is used as the power output terminal of the power transmission circuit. A second terminal of the second transmission transistor is coupled to the first node. A control terminal of the second transmission transistor is coupled to the control node. The first control circuit is coupled to the power input terminal, the power output terminal, and the control node. When a voltage of the power output terminal is greater than or equal to a voltage of the power input terminal, the first control circuit outputs a first voltage to the control node, to turn off the first transmission transistor and the second transmission transistor.

In an embodiment of the application, the foregoing at least one power transmission circuit is a plurality of power transmission circuits. When a voltage of the power input terminal of one of the power transmission circuits is greater than a voltage of the power bus, the first transmission transistor and the second transmission transistor of the one of the power transmission circuits are turned on, to enable the voltage of the power bus to be greater than or equal to a voltage of the power input terminal of a remaining one of the power transmission circuits, and the first transmission transistor and the second transmission transistor of the remaining one of the power transmission circuits are turned off.

Based on the foregoing, in the electronic device and the power transmission circuit of same provided in embodiments of the application, the power transmission circuit is implemented by using transistors, so that the power transmission circuit can have reduced power consumption, lower temperature, and higher power supply efficiency. Moreover, the transistors in each power transmission circuit are controlled to be turned on or off, a current of an input power that powers a device body can be prevented from flowing back to another input power. In addition, every power transmission circuit has a disable function, so that a power source can be selected for the device body. In this way, it can be more flexible to select a power source for the device body.

To make the foregoing features and advantages of the application more comprehensible, embodiments are described below in detail with reference to the accompanying drawings.

BRIEF DESCRIPTION OF THE DRAWINGS

The accompanying drawings in the following are a part of the specification of the application and show exemplary embodiments of the application. The accompanying drawings and the content of the specification are used together for describing the principle of the application.

DETAILED DESCRIPTION OF THE EMBODIMENTS

To make the content of the application more comprehensible, the following embodiments are examples that can be implemented according to the application. In addition, if possible, the elements/members/steps with the same numerals in accompanying drawings and implementations are the same or similar elements/members/steps.

Figure 1:
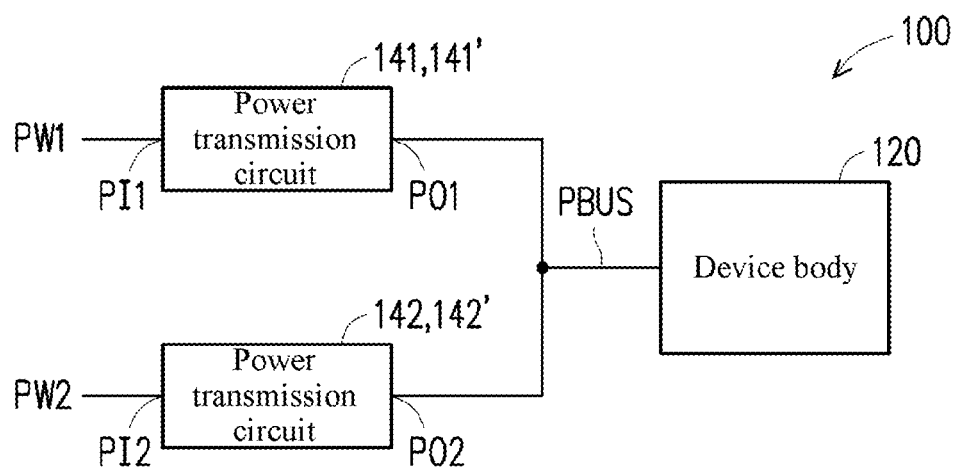
FIG. 1 is a schematic circuit block diagram of an electronic device according to an embodiment of the application.

FIG. 1 is a schematic circuit block diagram of an electronic device 100 according to an embodiment of the application. In an embodiment of the application, the electronic device 100 may be, for example, a notebook computer, a tablet computer or a cable modem. However, the application is not limited thereto. The electronic device 100 may include a device body 120 and at least one power transmission circuit. However, for ease of description and simplicity of the accompanying drawings, in the embodiment in FIG. 1, two power transmission circuits 141 and 142 are used as an example for description. An implementation with another quantity of power transmission circuits may be obtained by analogy according to the following descriptions.

As shown in FIG. 1, the device body 120 is coupled to a power bus PBUS to acquire power required for normal operation. The device body 120 includes a circuit used to perform major functions of the electronic device 100.

A power input terminal PI1 of the power transmission circuit 141 is used to receive an input power PW1, and a power output terminal PO1 of the power transmission circuit 141 is coupled to the power bus PBUS. The power transmission circuit 141 may determine, according to a value relationship between a voltage of the power input terminal PI1 (that is, the input power PW1) and a voltage of the power output terminal PO1 (that is, the power bus PBUS), whether to close an electrical transmission path between the power input terminal PI1 and the power output terminal PO1.

Similarly, a power input terminal PI2 of the power transmission circuit 142 is used to receive an input power PW2, and a power output terminal PO2 of the power transmission circuit 142 is coupled to the power bus PBUS. The power transmission circuit 142 may determine, according to a value relationship between a voltage of the power input terminal PI2 (that is, the input power PW2) and a voltage of the power output terminal PO2 (that is, the power bus PBUS), whether to close an electrical transmission path between the power input terminal PI2 and the power output terminal PO2.

Furthermore, if the voltage of the input power PW1 is greater than the voltage of the power bus PBUS, the power transmission circuit 141 closes the electrical transmission path between the power input terminal PI1 and the power output terminal PO1, to enable the input power PW1 to power the device body 120. If the voltage of the input power PW1 is less than or equal to the voltage of the power bus PBUS, the power transmission circuit 141 opens the electrical transmission path between the power input terminal PI1 and the power output terminal PO1, to prevent a current from flowing from the power bus PBUS back to the power input terminal PI1.

Similarly, if the voltage of the input power PW2 is greater than the voltage of the power bus PBUS, the power transmission circuit 142 closes the electrical transmission path between the power input terminal PI2 and the power output terminal PO2, to enable the input power PW2 to power the device body 120. If the voltage of the input power PW2 is less than or equal to the voltage of the power bus PBUS, the power transmission circuit 142 opens the electrical transmission path between the power input terminal PI2 and the power output terminal PO2, to prevent a current from flowing from the power bus PBUS back to the power input terminal PI2.

In an embodiment of the application, the input power PW1 and the input power PW2 may be supplied by different power supply devices. A value of the voltage of the input power PW1 may be equal to or not equal to a value of the voltage of the input power PW2, depending on actual application or design requirements.

In an embodiment of the application, if the voltage of the input power PW1 (that is, the voltage of the power input terminal PI1 of the power transmission circuit 141) is greater than the voltage of the power bus PBUS, the power transmission circuit 141 closes the electrical transmission path between the power input terminal PI1 and the power output terminal PO1. In this way, the voltage of the power bus PBUS may accordingly rise to be greater than or equal to the voltage of the input power PW2 (that is, the voltage of the power input terminal PI2 of the power transmission circuit 142). In this case, the power transmission circuit 142 opens the electrical transmission path between the power input terminal PI2 and the power output terminal PO2, to prevent a current from flowing from the power bus PBUS back to the power input terminal PI2, and vice versa.

In the embodiment shown in FIG. 1, a circuit architecture of the power transmission circuit 141 is similar to that of the power transmission circuit 142. Therefore, the power transmission circuit 141 is used as an example blow for description. The implementation of the power transmission circuit 142 may be obtained by analogy.

Figure 2:
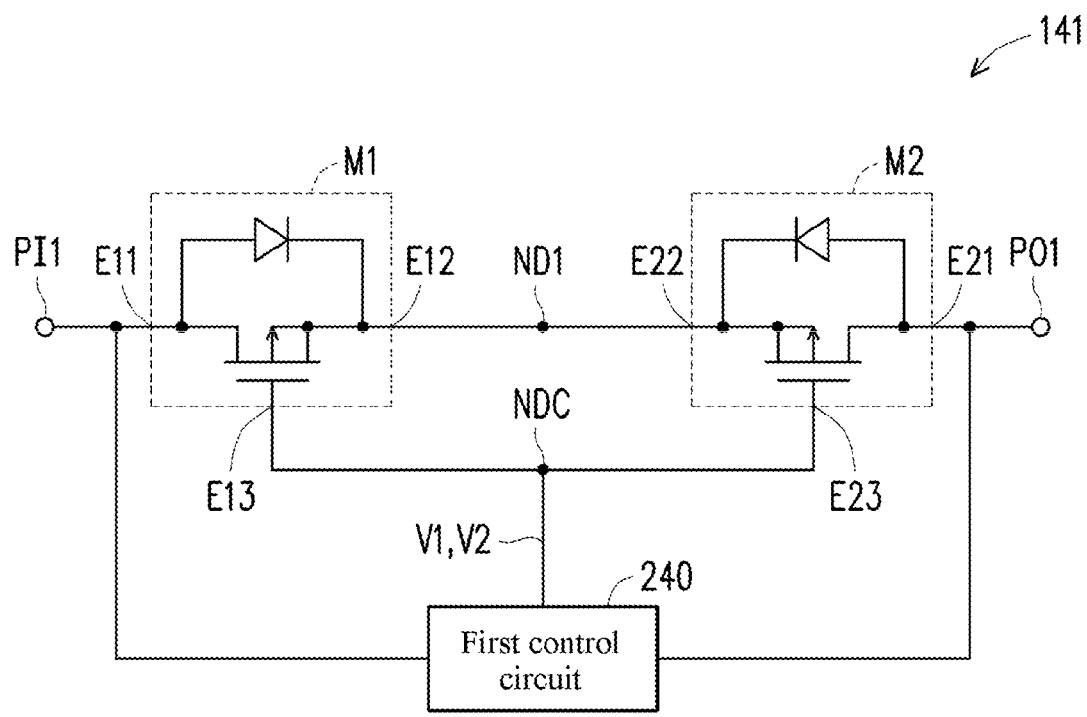
FIG. 2 is a schematic circuit block diagram of a power transmission circuit according to an embodiment of the application.

Refer to FIG. 1 and FIG. 2 together. FIG. 2 is a schematic circuit block diagram of the power transmission circuit 141 according to an embodiment of the application. The power transmission circuit 141 includes a first transmission transistor M1, a second transmission transistor M2, and a first control circuit 240. A first terminal E11 of the first transmission transistor M1 is used as the power input terminal PI1 of the power transmission circuit 141. A second terminal E12 of the first transmission transistor M1 is coupled to a first node ND1. A control terminal E13 of the first transmission transistor M1 is coupled to a control node NDC. A first terminal E21 of the second transmission transistor M2 is used as the power output terminal PO1 of the power transmission circuit 141. A second terminal E22 of the second transmission transistor M2 is coupled to the first node ND1. A control terminal E23 of the second transmission transistor M2 is coupled to the control node NDC.

The first control circuit 240 is coupled to the power input terminal PI1, the power output terminal PO1, and the control node NDC. When the voltage of the power output terminal PO1 is less than the voltage of the power input terminal PI1, the first control circuit 240 may output a second voltage V2 to the control node NDC, to turn on the first transmission transistor M1 and the second transmission transistor M2. In this way, the input power PW1 may be transmitted to the power bus PBUS through the first transmission transistor M1 and the second transmission transistor M2 to power the device body 120. Transistors (that is, the first transmission transistor M1 and the second transmission transistor M2) that are turned on have small capacitance values and low power consumption. Therefore, compared with a power transmission circuit in which a semiconductor is used, the power transmission circuit 141 shown in FIG. 2 has reduced power consumption, lower temperature, and higher power supply efficiency.

In contrast, when the voltage of the power output terminal PO1 is greater than or equal to the voltage of the power input terminal PI1, the first control circuit 240 may output a first voltage V1 to the control node NDC, to turn off the first transmission transistor M1 and the second transmission transistor M2. In this way, a current can be prevented from flowing from the power output terminal PO1 back to the power input terminal PI1 through the first transmission transistor M1 and the second transmission transistor M2.

In an embodiment of the application, the first transmission transistor M1 and the second transmission transistor M2 may be, for example, p-type metal-oxide-semiconductor field-effect transistors (MOSFET). However, the application is not limited thereto.

Figure 3:
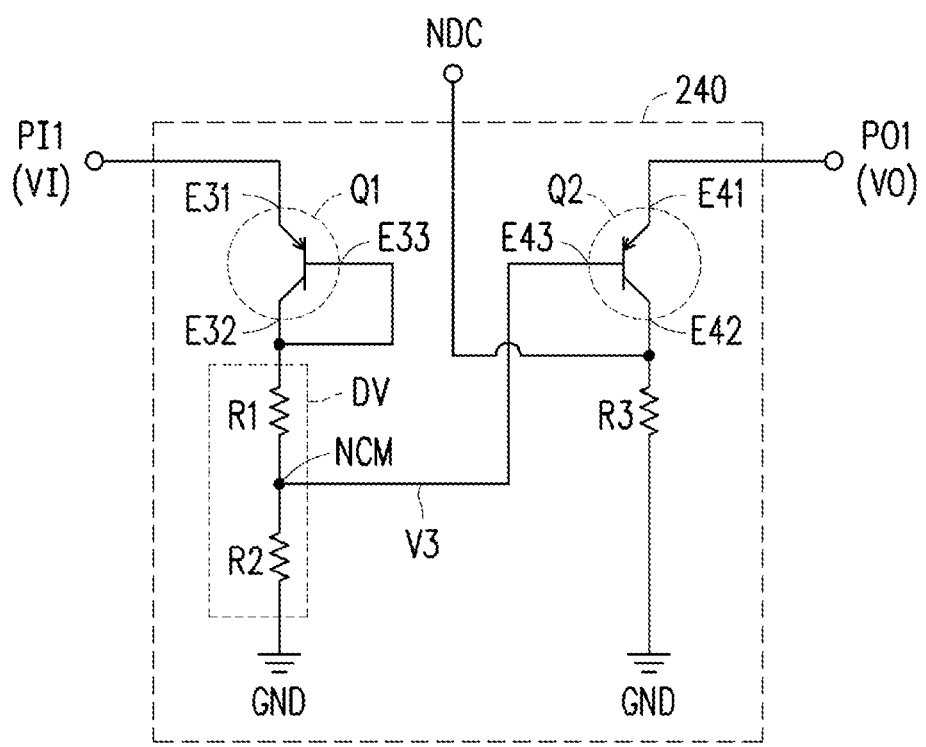
FIG. 3 is a schematic diagram of a circuit architecture of a first control circuit according to an embodiment of the application.

In an embodiment of the application, the first control circuit 240 may be implemented by using a differential amplification circuit. However, the application is not limited thereto. FIG. 3 is a schematic diagram of a circuit architecture of the first control circuit 240 according to an embodiment of the application. The first control circuit 240 may include a first input transistor Q1, a second input transistor Q2, a voltage divider circuit DV, and a capacitor R3. A first terminal E31 of the first input transistor Q1 is coupled to the power input terminal PI1. A second terminal E32 of the first input transistor Q1 is coupled to a control terminal E33 of the first input transistor Q1. The voltage divider circuit DV is coupled between the second terminal E32 of the first input transistor Q1 and a ground voltage terminal GND. The voltage divider circuit DV may divide a voltage of the second terminal E32 of the first input transistor Q1 according to a voltage division ratio to generate a third voltage V3. A first terminal E41 of the second input transistor Q2 is coupled to the power output terminal PO1. A second terminal E42 of the second input transistor Q2 is coupled to the control node NDC. A control terminal E43 of the second input transistor Q2 is coupled to the voltage divider circuit DV to receive the third voltage V3. The capacitor R3 is coupled between the second terminal E42 of the second input transistor Q2 and the ground voltage terminal GND.

In an embodiment of the application, the first input transistor Q1 and the second input transistor Q2 may be, for example, PNP bipolar junction transistors (BJT). However, the application is not limited thereto.

In an embodiment of the application, the voltage divider circuit DV may be implemented by using serially connected capacitors R1 and R2, and the third voltage V3 is generated at a common contact NCM between the capacitor R1 and R2. However, the application is not limited thereto. In addition, a capacitance value of the capacitor R1 is far less than a capacitance value of the capacitor R2.

The first control circuit 240 in FIG. 3 is used below to describe the specific operation of the power transmission circuit 141 in FIG. 2. It is assumed that a voltage VI of the power input terminal PI1 is 15 volts, a voltage VO of the power output terminal PO1 is 0 volts, critical voltages VTH of the first input transistor Q1 and the second input transistor Q2 are 0.7 volts, and the capacitance value of the capacitor R2 is 200 times the capacitance value of the capacitor R1 (that is, the voltage division ratio of the voltage divider circuit DV is 0.995). The third voltage V3 (that is, a voltage of the control terminal E43 of the second input transistor Q2) generated by the voltage divider circuit DV may be determined according to Formula (1). In this exemplary embodiment, a voltage value of the third voltage V3 is approximately 14.23 volts.

$$V3=(V1-VTH) \times R2/R1+R2 \qquad \text{Formula (1)}$$

A voltage difference (that is, VO−V3) of the first terminal E41 of the second input transistor Q2 and the control terminal E43 of the second input transistor Q2 is −14.23 volts and is less than the critical voltage VTH (is 0.7 volts) of the second input transistor Q2. Therefore, the second input transistor Q2 is in a cutoff state, so that a voltage of the control node NDC is a voltage of the ground voltage terminal GND and the first transmission transistor M1 and the second transmission transistor M2 are turned on. In this case, the input power PW1 may be transmitted to the power bus PBUS through the first transmission transistor M1 and the second transmission transistor M2, to power the device body 120.

When the voltage VO of the power output terminal PO1 rises to be greater than or equal to 15 volts, the voltage difference (that is, VO−V3) between the first terminal E41 of the second input transistor Q2 and the control terminal E43 of the second input transistor Q2 is 0.77 volts and is greater than the critical voltage VTH (is 0.7 volts) of the second input transistor Q2. Therefore, the second input transistor Q2 is turned on, so that the voltage of the control node NDC is approximately the voltage VO of the power output terminal PO1 and the first transmission transistor M1 and the second transmission transistor M2 are turned off, so that a current is prevented from flowing from the power output terminal PO1 back to the power input terminal PI1.

It should be noted that an error may exist between the second input transistor Q2 and the first input transistor Q1. To be specific, the critical voltage of the first input transistor Q1 may be less than the critical voltage of the second input transistor Q2. Therefore, the voltage division ratio of the voltage divider circuit DV is adjusted to reduce a voltage value of the third voltage V3 to compensate for the foregoing error between the second input transistor Q2 and the first input transistor Q1, so that it is ensured that the first transmission transistor M1 and the second transmission transistor M2 are actually in a cutoff state when the voltage VO of the power output terminal PO1 is greater than or equal to the voltage VI of the power input terminal PI1.

Figure 4:
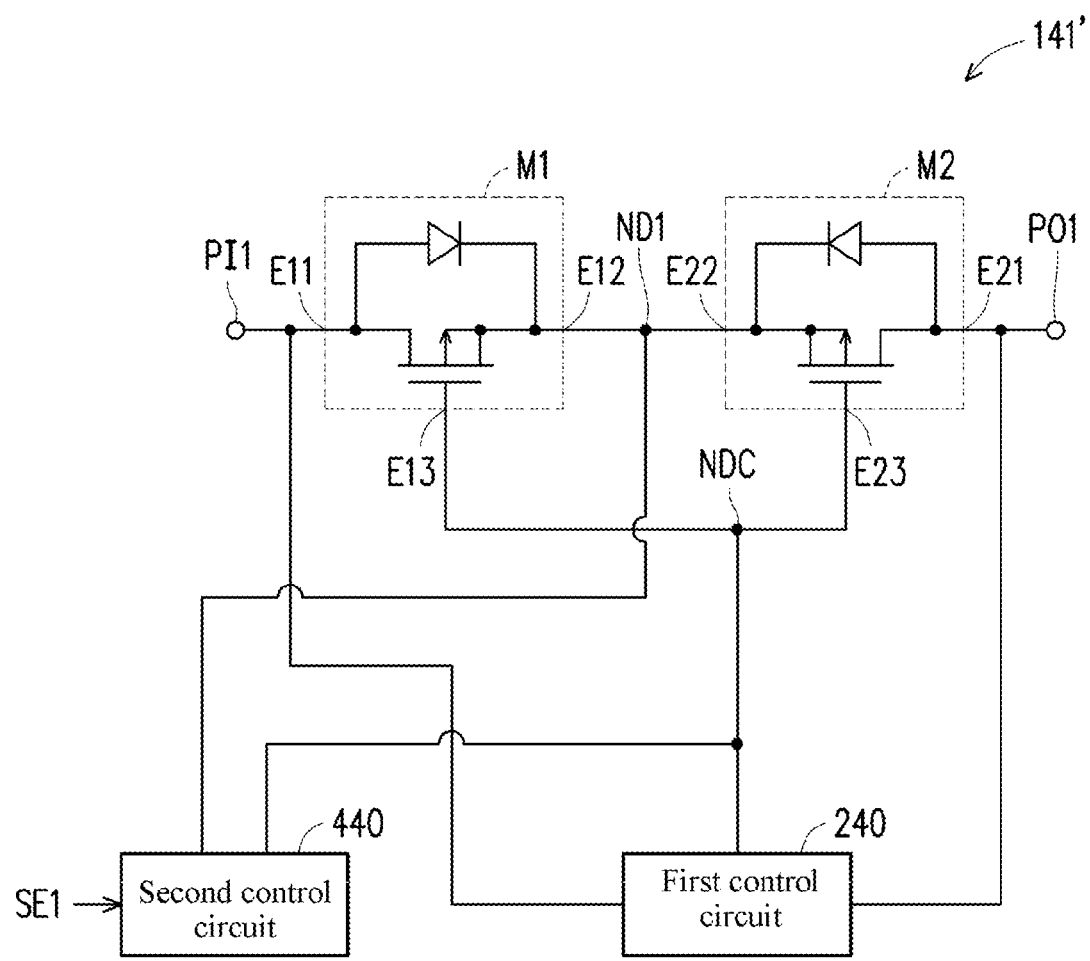
FIG. 4 is a schematic circuit block diagram of a power transmission circuit according to another embodiment of the application.

Refer to FIG. 1 and FIG. 4 together. FIG. 4 is a schematic circuit block diagram of a power transmission circuit 141' according to another embodiment of the application, so that it can be more flexible to select a power source for the device body 120. In addition, a circuit architecture of a power transmission circuit 142' is similar to that of the power transmission circuit 141'. Therefore, the implementation of the power transmission circuit 142' may be obtained by analogy according to the following descriptions.

The power transmission circuit 141' includes a first transmission transistor M1, a second transmission transistor M2, a first control circuit 240, and a second control circuit 440. The implementations of the first transmission transistor M1, the second transmission transistor M2, and the first control circuit 240 in FIG. 4 are respectively similar to the first transmission transistor M1, the second transmission transistor M2, and the first control circuit 240 in FIG. 2. Therefore, reference may be made to the foregoing related descriptions, and details are not described herein again. The second control circuit 440 is coupled to the first node ND1 and the control node NDC, and receives a corresponding disable signal SE1. The second control circuit 440 may turn off the first transmission transistor M1 and the second transmission transistor M2 in response to the disable signal SE1, to open the electrical transmission path between the power input terminal PI1 and the power output terminal PO1.

In an embodiment of the application, if the disable signal SE1 is at a first level, the second control circuit 440 may turn off the first transmission transistor M1 and the second transmission transistor M2 in response to the disable signal SE1 at the first level. In contrast, if the disable signal SE1 is at a second level or the second control circuit 440 does not receive the disable signal SE1, the first control circuit 240 controls the first transmission transistor M1 and the second transmission transistor M2 to be turned on or off. For the specific operation of controlling the first transmission transistor M1 and the second transmission transistor M2 by the first control circuit 240, reference may be made to the foregoing related descriptions of FIG. 2 and FIG. 3, and details are not described herein again.

It may be understood that if the input power PW2 needs to be selected as a power source for the device body 120, the disable signal SE1 at the first level is provided to the power transmission circuit 141', to open the electrical transmission path between the power input terminal PI1 and the power output terminal PO1, and another disable signal at the second level is provided to the power transmission circuit 142' (or a disable signal is not provided to the power transmission circuit 142'). In contrast, if the input power PW1 needs to be selected as a power source for the device body 120, another disable signal at the first level is provided to the power transmission circuit 142', to open the electrical transmission path between the power input terminal PI2 and the power output terminal PO2, and the disable signal SE1 at the second level is provided to the power transmission circuit 141' (or the disable signal SE1 is not provided to the power transmission circuit 141'). In this way, it can be more flexible to select a power source for the device body 120.

In an embodiment of the application, the electronic device 100 may further include a button module (not shown). The button module is coupled to the power transmission circuits 141', 142', and has a plurality of buttons. The button module may generate and output a corresponding disable signal to a corresponding power transmission circuit in response to the pressing of a corresponding button, to disable or enable the corresponding power transmission circuit. In this way, a user may use the button module to select a power source for the device body 120.

In another embodiment of the application, the device body 120 may include a power setting application (not shown). A user may have the device body 120 perform the power setting application, so that a screen of the device body 120 displays a user interface (UI) of the power setting application. The UI of the power setting application may include disable/enable options corresponding to the power transmission circuits 141', 142'. The device body 120 may generate and output the corresponding disable signal SE1 to the power transmission circuit 141' according to the disable/enable option corresponding to the power transmission circuit 141' in the UI to disable or enable the power transmission circuit 141'. Similarly, the device body 120 may generate and output the corresponding disable signal to the power transmission circuit 142' according to the disable/enable option corresponding to the power transmission circuit 142' in the UI, to disable or enable the power transmission circuit 142'. In this way, the user may click the enable/disable options corresponding to the power transmission circuits 141', 142' to select power source for the device body 120.

Figure 5:
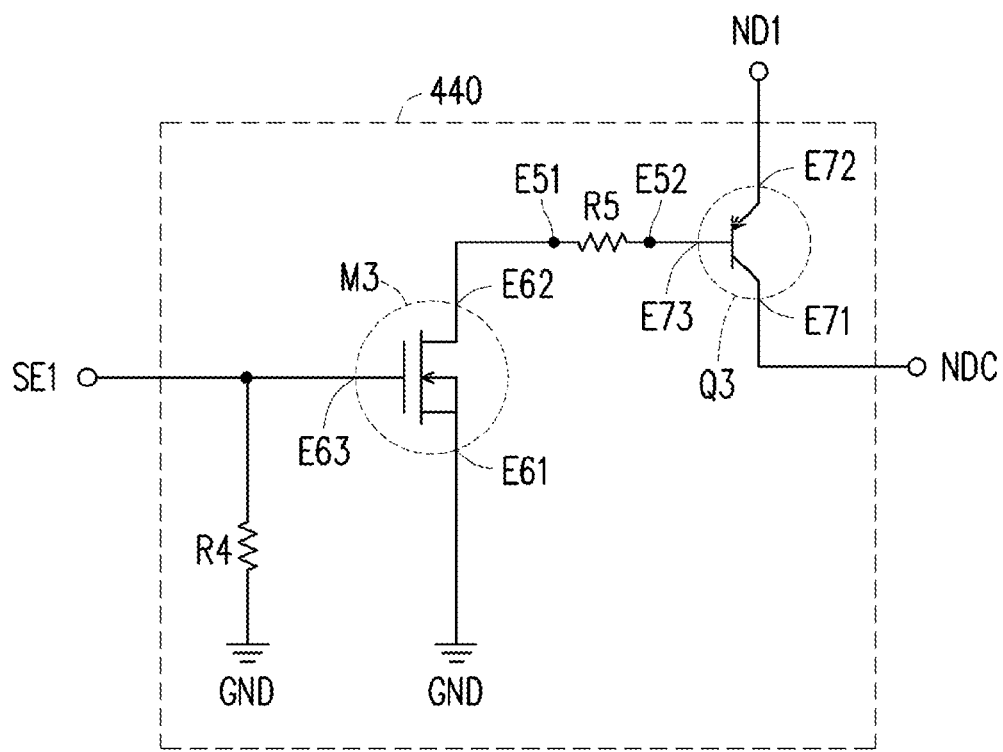
FIG. 5 is a schematic diagram of a circuit architecture of a second control circuit according to an embodiment of the application.

Refer to FIG. 4 and FIG. 5 together. FIG. 5 is a schematic diagram of a circuit architecture of the second control circuit 440 according to an embodiment of the application. The second control circuit 440 may include a first control transistor M3, a second control transistor Q3, and capacitors R4 and R5. A first terminal E61 of the first control transistor M3 is coupled to a ground voltage terminal GND. A control terminal E63 of the first control transistor M3 receives the corresponding disable signal SE1. The capacitor R4 is coupled between the control terminal E63 of the first control transistor M3 and the ground voltage terminal GND. A first terminal E51 of the capacitor R5 is coupled to a second terminal E62 of the first control transistor M3. A first terminal E71 of the second control transistor Q3 is coupled to the control node NDC. A second terminal E72 of the second control transistor Q3 is coupled to the first node ND1. A control terminal E73 of the second control transistor Q3 is coupled to a second terminal E52 of the capacitor R5.

In an embodiment of the application, the first control transistor M3 may be, for example, an n-type MOSFET, and the second control transistor Q3 may be, for example, a PNP BJT. The application is not limited thereto.

The specific operation of the second control circuit 440 is described below. When the disable signal SE1 is at a logic high level, the first control transistor M3 is turned on, to enable the second control transistor Q3 to be turned on. In this case, the voltage of the control node NDC is approximately equal to the voltage of the first node ND1, to enable the first transmission transistor M1 and the second transmission transistor M2 in FIG. 4 to be turned off. In contrast, when the disable signal SE1 is at a logic low level or the second control circuit 440 does not receive the disable signal SE1, the first control transistor M3 is cut off, to enable the second control transistor Q3 to be cut off. Therefore, the voltage of the control node NDC is controlled by the first control circuit 240. To be specific, the first transmission transistor M1 and the second transmission transistor M2 are controlled by the first control circuit 240.

In conclusion, in the electronic device and the power transmission circuit of same provided in embodiments of the application, the power transmission circuit is implemented by using transistors, so that the power transmission circuit can have reduced power consumption, lower temperature, and higher power supply efficiency. Moreover, the transistors in each power transmission circuit are controlled to be turned on or off, a current of an input power that powers a device body can be prevented from flowing back to another input power. In addition, every power transmission circuit has a disable function, so that a power source can be selected for the device body. In this way, it can be more flexible to select a power source for the device body.

Although the application has been described above by using the embodiments, the embodiments are not used to limit the application. Any person of ordinary skill in the art may make several variations and modifications without departing from the spirit and scope of the application. Therefore, the protection scope of the application should be as defined by the appended claims.

What is claimed is:

1. A power transmission circuit, comprising:
   a first transmission transistor, a first terminal of the first transmission transistor being used as a power input terminal of the power transmission circuit, a second terminal of the first transmission transistor being coupled to a first node, and a control terminal of the first transmission transistor being coupled to a control node;
   a second transmission transistor, a first terminal of the second transmission transistor being used as a power output terminal of the power transmission circuit, a second terminal of the second transmission transistor being coupled to the first node, and a control terminal of the second transmission transistor being coupled to the control node; and
   a first control circuit, coupled to the power input terminal, the power output terminal, and the control node, wherein when a voltage of the power output terminal is greater than or equal to a voltage of the power input terminal, the first control circuit outputs a first voltage to the control node, to turn off the first transmission transistor and the second transmission transistor, wherein the first control circuit comprises:
   a first input transistor, a first terminal of the first input transistor being coupled to the power input terminal, and a second terminal of the first input transistor being coupled to a control terminal of the first input transistor;
   a voltage divider circuit, coupled between the second terminal of the first input transistor and a ground voltage terminal, and used to divide a voltage of the second terminal of the first input transistor to generate a third voltage;
   a second input transistor, a first terminal of the second input transistor being coupled to the power output terminal, a second terminal of the second input transistor being coupled to the control node, and a control terminal of the second input transistor being coupled to the voltage divider circuit to receive the third voltage; and
   a capacitor, coupled between the second terminal of the second input transistor and the ground voltage terminal.

2. The power transmission circuit according to claim 1, wherein when the voltage of the power output terminal is less than the voltage of the power input terminal, the first control circuit outputs a second voltage to the control node, to turn on the first transmission transistor and the second transmission transistor.

3. The power transmission circuit according to claim 1, further comprising:
   a second control circuit, coupled to the first node and the control node, and receiving a disable signal, wherein the second control circuit turns off the first transmission transistor and the second transmission transistor in response to the disable signal.

4. The power transmission circuit according to claim 3, wherein the second control circuit comprises:
   a first control transistor, a first terminal of the first control transistor being coupled to a ground voltage terminal, and a control terminal of the first control transistor receiving the disable signal;
   a first capacitor, coupled between the control terminal of the first control transistor and the ground voltage terminal;
   a second capacitor, a first terminal of the second capacitor being coupled to a second terminal of the first control transistor; and
   a second control transistor, a first terminal of the second control transistor being coupled to the control node, a second terminal of the second control transistor being coupled to the first node, and a control terminal of the second control transistor being coupled to a second terminal of the second capacitor.

5. An electronic device, comprising:
   a device body, coupled to a power bus; and
   at least one power transmission circuit, a power input terminal of each of the at least one power transmission circuit being used to receive one of at least one input power, and the power output terminal of each of the at least one power transmission circuit being coupled to the power bus to power the device body,
   wherein each of the at least one power transmission circuit comprises:
   a first transmission transistor, a first terminal of the first transmission transistor being used as the power input terminal of the power transmission circuit, a second terminal of the first transmission transistor being coupled to a first node, and a control terminal of the first transmission transistor being coupled to a control node;
   a second transmission transistor, a first terminal of the second transmission transistor being used as the power output terminal of the power transmission circuit, a second terminal of the second transmission transistor being coupled to the first node, and a control terminal of the second transmission transistor being coupled to the control node; and a first control circuit, coupled to the power input terminal, the power output terminal, and the control node, wherein when a voltage of the power output terminal is greater than or equal to a voltage of the power input terminal, the first control circuit outputs a first voltage to the control node, to turn off the first transmission transistor and the second transmission transistor, wherein the first control circuit comprises:

a first input transistor, a first terminal of the first input transistor being coupled to the power input terminal, and a second terminal of the first input transistor being coupled to a control terminal of the first input transistor;

a voltage divider circuit, coupled between the second terminal of the first input transistor and a ground voltage terminal, and used to divide a voltage of the second terminal of the first input transistor to generate a third voltage;

a second input transistor, a first terminal of the second input transistor being coupled to the power output terminal, a second terminal of the second input transistor being coupled to the control node, and a control terminal of the second input transistor being coupled to the voltage divider circuit to receive the third voltage; and a capacitor, coupled between the second terminal of the second input transistor and the ground voltage terminal.

6. The electronic device according to claim 5, wherein when the voltage of the power output terminal is less than the voltage of the power input terminal, the first control circuit outputs a second voltage to the control node, to turn on the first transmission transistor and the second transmission transistor.

7. The electronic device according to claim 5, wherein each of the at least one power transmission circuit further comprises:

a second control circuit, coupled to the first node and the control node, and receiving a disable signal, wherein the second control circuit turns off the first transmission transistor and the second transmission transistor in response to the disable signal.

8. The electronic device according to claim 7, wherein the second control circuit comprises:

a first control transistor, a first terminal of the first control transistor being coupled to a ground voltage terminal, and a control terminal of the first control transistor receiving the disable signal;

a first capacitor, coupled between the control terminal of the first control transistor and the ground voltage terminal;

a second capacitor, a first terminal of the second capacitor being coupled to a second terminal of the first control transistor; and a second control transistor, a first terminal of the second control transistor being coupled to the control node, a second terminal of the second control transistor being coupled to the first node, and a control terminal of the second control transistor being coupled to a second terminal of the second capacitor.

9. The electronic device according to claim 5, wherein the at least one power transmission circuit is a plurality of power transmission circuits, wherein when a voltage of the power input terminal of one of the power transmission circuits is greater than a voltage of the power bus, the first transmission transistor and the second transmission transistor of the one of the power transmission circuits are turned on, to enable the voltage of the power bus to be greater than or equal to a voltage of the power input terminal of a remaining one of the power transmission circuits, and the first transmission transistor and the second transmission transistor of the remaining one of the power transmission circuits are turned off.

* * * * *